(12) United States Patent
Haruki et al.

(10) Patent No.: US 12,000,658 B2
(45) Date of Patent: Jun. 4, 2024

(54) HEAT TRANSPORT SYSTEM AND TRANSPORTATION MACHINE

(71) Applicant: Kawasaki Jukogyo Kabushiki Kaisha, Kobe (JP)

(72) Inventors: Yu Haruki, Kobe (JP); Keiji Sakagawa, Kobe (JP); Kazuhide Hakamada, Kobe (JP); Ryosuke Mitani, Kobe (JP)

(73) Assignee: KAWASAKI JUKOGYO KABUSHIKI KAISHA, Kobe (JP)

( * ) Notice: Subject to any disclaimer, the term of this patent is extended or adjusted under 35 U.S.C. 154(b) by 432 days.

(21) Appl. No.: 17/418,248

(22) PCT Filed: Dec. 24, 2019

(86) PCT No.: PCT/JP2019/050595
§ 371 (c)(1),
(2) Date: Jun. 25, 2021

(87) PCT Pub. No.: WO2020/138077
PCT Pub. Date: Jul. 2, 2020

(65) Prior Publication Data
US 2022/0090866 A1    Mar. 24, 2022

(30) Foreign Application Priority Data

Dec. 27, 2018  (JP) ................. 2018-245270

(51) Int. Cl.
*F28D 15/02*  (2006.01)
*B64C 1/00*  (2006.01)
(Continued)

(52) U.S. Cl.
CPC ............ *F28D 15/0266* (2013.01); *B64C 1/00* (2013.01); *F28D 15/06* (2013.01);
(Continued)

(58) Field of Classification Search
CPC .... F28D 15/0266; F28D 15/043; F28D 15/06; F28D 2015/0216; F28D 2021/0021; B64C 1/00
(Continued)

(56) References Cited

U.S. PATENT DOCUMENTS 4,092,830 A * 6/1978 Rilett ................. F02B 75/34
60/671
5,725,049 A * 3/1998 Swanson ............. F28D 15/043
122/366
(Continued)

FOREIGN PATENT DOCUMENTS

JP   60-159565 A   8/1985
JP    5-39963 A   2/1993
(Continued)

*Primary Examiner* — Joel M Attey
(74) *Attorney, Agent, or Firm* — XSENSUS LLP (57) ABSTRACT

A heat transport system includes: a two-phase closed loop heat pipe; a pump disposed in a liquid conduit or a vapor conduit of the loop heat pipe to exert a circulation drive force on a working fluid; a tilt sensor that detects a tilt of the loop heat pipe; and a controller configured to run the pump if the tilt is greater than a predetermined tilt threshold and stop the pump if the tilt is equal to or smaller than the tilt threshold.

7 Claims, 5 Drawing Sheets

(51) Int. Cl.
*F28D 15/06* (2006.01)
*F28D 15/04* (2006.01)
*F28D 21/00* (2006.01)

(52) U.S. Cl.
CPC .... *F28D 2015/0216* (2013.01); *F28D 15/043* (2013.01); *F28D 2021/0021* (2013.01)

(58) Field of Classification Search
USPC ........................................ 165/104.19, 104.26
See application file for complete search history.

(56) References Cited

U.S. PATENT DOCUMENTS

| | | | |
|---|---|---|---|
| 2008/0264068 A1* | 10/2008 | Nakasuka | F28D 15/0266 |
| | | | 62/3.3 |
| 2013/0189594 A1 | 7/2013 | Breit et al. | |
| 2013/0306278 A1* | 11/2013 | Hoang | F28D 15/043 |
| | | | 165/104.26 |
| 2016/0380279 A1* | 12/2016 | Breit | B64C 1/40 |
| | | | 429/436 |
| 2019/0186843 A1* | 6/2019 | Takeuchi | H01M 10/63 |

FOREIGN PATENT DOCUMENTS

| | | |
|---|---|---|
| JP | 2013-191545 A | 9/2013 |
| JP | 2014-134335 A | 7/2014 |
| JP | 2017-17199 A | 1/2017 |
| WO | 2018/047529 A1 | 3/2018 |

\* cited by examiner

HEAT TRANSPORT SYSTEM AND TRANSPORTATION MACHINE

CROSS-REFERENCE TO RELATED APPLICATIONS

This application is based on PCT filing PCT/JP2019/050595, filed Dec. 24, 2019, which claims priority to and the benefit of Japanese Patent Application No. 2018-245270, filed on Dec. 27, 2018, the entire disclosure of each are incorporated herein by reference.

TECHNICAL FIELD

The present invention relates to a heat transport system employing a loop heat pipe and a transportation machine including the heat transport system.

BACKGROUND ART

A loop heat pipe technology has been traditionally known which uses phase changes of a working fluid to achieve high-density heat transport. A heat transport system employing such a loop heat pipe has been used, for example, to cool an electronic device such as a computer or home electric appliance. In some loop heat pipes, the working fluid is circulated by means of capillary force and/or gravity.

A loop heat pipe includes a closed loop formed by an evaporator, a condenser, a vapor conduit leading from the evaporator to the condenser, and a liquid conduit leading from the condenser to the evaporator. The closed loop is charged with a working fluid. In the evaporator, the working fluid in a liquid phase is heated by heat transferred from a heat-generating element, and a part of the working fluid changes into a gas phase. The gas-liquid two-phase working fluid moves in the vapor conduit under the action of pressure difference and buoyancy and reaches the condenser. In the condenser, the working fluid is cooled into the liquid phase. The liquid-phase working fluid returns to the evaporator under the action of capillary force and/or gravity. In this manner, the loop heat pipe allows the working fluid to circulate in the two-phase closed loop and transport heat from the evaporator to the condenser, thereby cooling the heat-generating element thermally connected to the evaporator.

When the loop heat pipe as described above is one which uses gravity for circulation of the working fluid, placing the evaporator below the condenser can ensure effective heat transport performance. However, such placement of the evaporator imposes restrictions on the installation of the heat pipe. In this context, Patent Literature 1 proposes disposing a pump in a return liquid conduit of a loop heat pipe and using the pump to effect forced circulation of the working fluid in order to increase the flexibility in installing the loop heat pipe.

CITATION LIST

Patent Literature

PTL 1: Japanese Laid-Open Patent Application Publication No. 2017-17199

SUMMARY OF INVENTION

Technical Problem

Electronic devices have become more and more sophisticated and miniaturized, and this has recently led to a growing demand for thermal management in transportation machines such as watercrafts, railcars, automobiles, and aircrafts which are equipped with a large number of the sophisticated, miniaturized devices. Some transportation machines incorporate a heat transport system including a loop heat pipe as described above which uses gravity for circulation of a working fluid, and such a transportation machine, the position of the body of which constantly changes, suffers a position change-induced decrease in the drive force for allowing the working fluid to circulate and a corresponding decrease in the heat transport rate.

In a pump-equipped loop heat pipe as disclosed in Patent Literature 1, a stable heat transport rate can be ensured since the working fluid circulates at a constant flow rate. However, this loop heat pipe always needs to receive external energy for running of the pump.

The present invention has been made in view of the above circumstances, and an object of the present invention is to provide a heat transport system employing a loop heat pipe and a transportation machine including the heat transport system, the heat transport system and transportation machine being adapted to ensure a stable heat transport rate despite changes in the positon of the loop heat pipe and at the same time achieve a reduction in external energy consumption.

Solution to Problem

A heat transport system according to an aspect of the present invention is incorporated into a transportation machine and includes: a loop heat pipe charged with a working fluid, the loop heat pipe including an evaporator that changes at least a part of the working fluid from a liquid phase into a gas phase by heat absorbed from a heat source, a condenser located above the evaporator to change the working fluid from the gas phase into the liquid phase, a vapor conduit connecting an outlet of the evaporator and an inlet of the condenser, and a liquid conduit connecting an outlet of the condenser and an inlet of the evaporator; a pump disposed in the liquid conduit or the vapor conduit to exert a circulation drive force on the working fluid; a tilt sensor that detects a tilt of the loop heat pipe; and a controller that controls operation of the pump based on the tilt. The working fluid in the liquid conduit flows from the condenser to the evaporator without being subjected to the action of the pump when the pump is at rest, and is forced to flow from the condenser to the evaporator under the action of the pump when the pump is running. The controller is configured to run the pump if the tilt is greater than a predetermined tilt threshold and stop the pump if the tilt is equal to or smaller than the tilt threshold.

In the above heat transport system, when the tilt of the loop heat pipe is equal to or smaller than the threshold, i.e., during steady-state operation, the pump is at rest, and the working fluid circulates in the loop heat pipe without the need for external energy. When the tilt of the loop heat pipe is greater than the threshold, the gravity-derived circulation drive force acting on the working fluid decreases, while the pump exerts a circulation drive force on the working fluid to compensate for the decrease in the gravity-derived force. Thus, in the heat transport system, the working fluid circulates stably irrespective of changes in the position of the loop heat pipe, and a stable heat transport rate can be achieved. Although the above heat transport system requires external energy for running of the pump, the pump runs only under predetermined conditions and is at rest under the other conditions. As such, the consumption of external energy can be lower than in the case where the pump is always running. For the above reasons, the heat transport system of the present invention can ensure a stable heat transfer rate despite changes in the position of the loop heat pipe and at the same time achieve a reduction in external energy consumption.

A heat transport system according to an aspect of the present invention is incorporated into a transportation machine and includes: a loop heat pipe charged with a working fluid, the loop heat pipe including an evaporator that changes at least a part of the working fluid from a liquid phase into a gas phase by heat absorbed from a heat source, a condenser located above the evaporator to change the working fluid from the gas phase into the liquid phase, a vapor conduit connecting an outlet of the evaporator and an inlet of the condenser, and a liquid conduit connecting an outlet of the condenser and an inlet of the evaporator; a pump disposed in the liquid conduit or the vapor conduit to exert a circulation drive force on the working fluid; a tilt sensor that detects a tilt of the loop heat pipe; a temperature sensor that detects a temperature of the heat source; and a controller that controls operation of the pump. The working fluid in the liquid conduit flows from the condenser to the evaporator without being subjected to the action of the pump when the pump is at rest, and is forced to flow from the condenser to the evaporator under the action of the pump when the pump is running. The controller is configured to: run the pump if the tilt is greater than a predetermined tilt threshold and the temperature of the heat source is higher than a predetermined first temperature threshold; stop the pump if the tilt is greater than the tilt threshold and the temperature of the heat source is equal to or lower than the first temperature threshold; run the pump if the tilt is equal to or smaller than the tilt threshold and the temperature of the heat source is higher than a predetermined second temperature threshold; and stop the pump if the tilt is equal to or smaller than the tilt threshold and the temperature of the heat source is equal to or lower than the second temperature threshold.

In the above heat transport system, even when the tilt of the loop heat pipe is greater than the tilt threshold, cooling of the heat source is determined to be sufficient if the temperature of the heat source is equal to or lower than the first temperature threshold, and the pump is stopped or kept at rest, so that the working fluid circulates in the loop heat pipe without the need for external energy. Thus, the heat transport rate of the loop heat pipe can be stabilized more economically. In the heat transport system, even when the tilt of the loop heat pipe is equal to or smaller than the tilt threshold, the pump is started or kept running to exert an additional circulation drive force on the working fluid if the temperature of the heat source is higher than the second temperature threshold. Thus, the degree of cooling of the heat source by the evaporator can be stabilized. Although the heat transport system requires external energy for running of the pump, the pump runs only under predetermined conditions and is at rest under the other conditions. As such, the consumption of external energy can be lower than in the case where the pump is always running. For the above reasons, the heat transport system can exhibit stable heat transfer performance despite changes in the position of the loop heat pipe and at the same time achieve a reduction in external energy consumption.

A transportation machine according to an aspect of the present invention includes a heat-generating element and the heat transport system as defined above, and the evaporator of the heat transport system uses the heat-generating element as a heat source to evaporate the working fluid.

In the heat transport system, as previously stated, the working fluid circulates stably irrespective of changes in the position of the loop heat pipe, and a stable heat transport rate can be achieved. As such, the heat transport system is suitable for cooling a heat-generating element mounted on a transportation machine the position of which constantly changes.

Advantageous Effects of Invention

The present invention can provide a heat transport system employing a loop heat pipe and a transportation machine including the heat transport system, the heat transport system and transportation machine being adapted to ensure a stable heat transport rate despite changes in the positon of the loop heat pipe and at the same time achieve a reduction in external energy consumption.

DESCRIPTION OF EMBODIMENTS

Configuration of Heat Transport System 1

Figure 1:
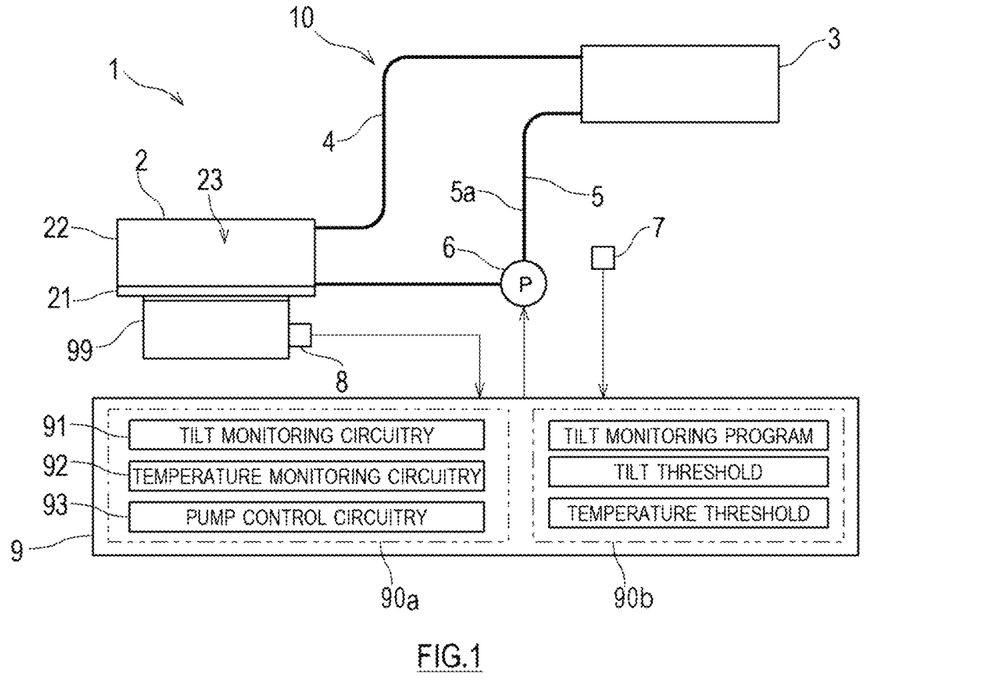
FIG. 1 illustrates a schematic configuration of a heat transport system according to an exemplary embodiment of the present invention.

Hereinafter, an exemplary embodiment of the present invention will be described with reference to the drawings. FIG. 1 illustrates a schematic configuration of a heat transport system 1 according to the exemplary embodiment of the present invention.

The heat transport system 1 of FIG. 1 includes a loop heat pipe 10, a pump 6 disposed in the loop heat pipe 10, a tilt sensor 7, a temperature sensor 8, and a controller 9.

Loop Heat Pipe 10

The loop heat pipe 10 is a natural circulation loop heat pipe of the thermosyphon type. The loop heat pipe 10 includes a two-phase closed loop formed by an evaporator 2, a vapor conduit 4, a condenser 3, and a return liquid conduit 5. The two-phase closed loop is degassed beforehand to remove a non-condensable gas such as air and then charged with a working fluid. The working fluid is not limited to particular fluids, and may be a condensable fluid commonly used as a working fluid in heat pipes. Examples of the condensable fluid include water, an alcohol, ammonia, a fluorocarbon, a hydrofluorocarbon, a hydrofluoroether, and a liquid mixture of these fluids.

The evaporator 2 includes, for example, a heat transfer plate 21 and a housing 22 defining a working fluid-receiving chamber 23. The heat transfer plate 21 is thermally connected to a heat source 99, for example, via thermal grease or a heat transfer sheet. The heat source 99 may be, for example, a heat-generating element such as an electronic component. In this evaporator 2, the working fluid in the working fluid-receiving chamber 23 absorbs heat from the heat source 99 via the heat transfer plate 21, and a part of the working fluid boils and changes into the gas phase. The two-phase working fluid consisting of the vapor phase resulting from the boiling and the liquid phase moves in the vapor conduit 4 connecting the outlet of the evaporator 2 and the inlet of the condenser 3 under the action of pressure difference and buoyancy and reaches the condenser 3.

The condenser 3 is located above the evaporator 2. The condenser 3 is provided with a cooling path (not shown), and the two-phase working fluid releases heat and is cooled into the liquid phase during passage through the cooling path. The liquid-phase working fluid descends in the liquid conduit 5 connecting the outlet of the condenser 3 and the inlet of the evaporator 2 under the action of gravity and returns to the evaporator 2.

The loop heat pipe 10 can switch the circulation mode of the working fluid between passive and active modes. In the passive mode, the pump 6 is at rest, and the working fluid naturally circulates in the loop heat pipe 10 by making use of phase changes and gravity. That is, when the loop heat pipe 10 is in the passive mode, the working fluid circulates under the action of head-related pressure difference. In the active mode, the pump 6 runs, and the working fluid circulates in the loop heat pipe 10 under the action of the circulation drive force exerted by the pump 6 and gravity.

Pump 6

The pump 6 is disposed in the liquid conduit 5 of the loop heat pipe 10. Desirably, the pump 6 is located in that downstream portion of the liquid conduit 5 in which the flowing working fluid is invariably in the liquid phase, since passage of any gas through the pump 6 makes the operation of the pump 6 unstable. The liquid conduit 5 is provided with a flow path 5a such that when the pump 6 is at rest, the working fluid flows from the condenser 3 to the evaporator 2 without being subjected to the action of the pump 6 and that when the pump 6 is running, the working fluid is forced to flow from the condenser 3 to the evaporator 2 under the action of the pump 6.

The pump 6 is defined as a device for exerting a drive force (circulation drive force) on the working fluid to allow the working fluid to flow in the loop heat pipe 10. The pump 6 is not limited to particular types. For example, an electric pump 6A (see FIG. 2), a magnetic fluid-driving pump 6B (see FIG. 3), or a tank pressure pump 6C (see FIG. 4) may be used. Although in the exemplary embodiment the pump 6 is disposed in the liquid conduit 5, the pump 6 may be disposed in the vapor conduit 4.

Figure 2:
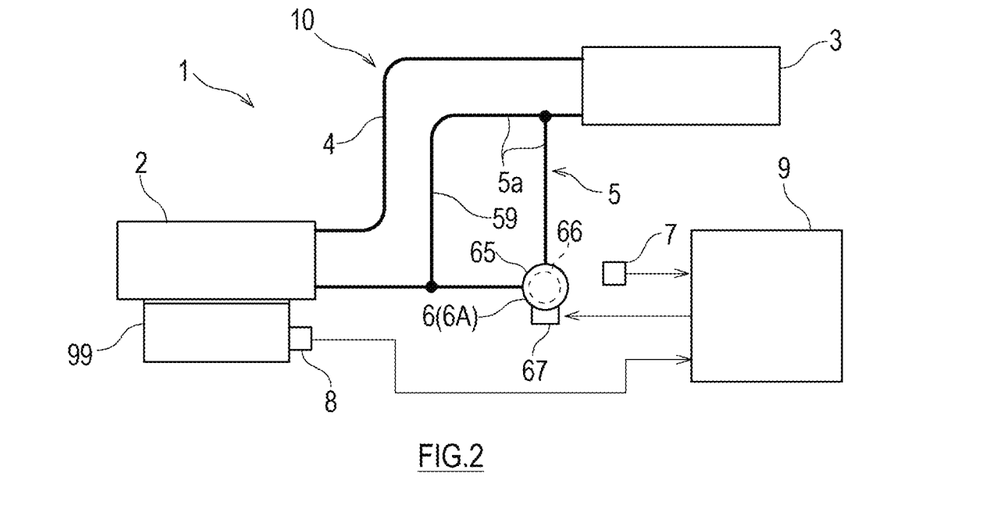
FIG. 2 illustrates a schematic configuration of the heat transport system in which an electric pump is used as the pump of FIG. 1.

FIG. 2 illustrates a schematic configuration of the heat transport system 1 in which the electric pump 6A is used as the pump 6 of FIG. 1. The electric pump 6A of FIG. 2 includes a casing 65 located in the liquid conduit 5, an impeller 66 enclosed in the casing 65, and an electric motor 67 that rotationally drives the impeller 66. The electric pump 6A is not limited to this configuration, and any known electric pump may be used. The driving and stopping of the electric motor 67, namely the running and stopping of the pump, are controlled by the controller 9. When at rest, the electric pump 6A could disturb the flow of the working fluid. To avoid this, the liquid conduit 5 is provided with a bypass conduit 59 through which the working fluid bypasses the electric pump 6A and flows into the evaporator 2.

In the loop heat pipe 10 provided with the pump 6A configured as described above, the working fluid in the liquid conduit 5 bypasses the pump 6A by flowing through the bypass conduit 59 when the circulation mode is the passive mode, and is pumped to the evaporator 2 by the pump 6A when the circulation mode is the active mode.

Figure 3:
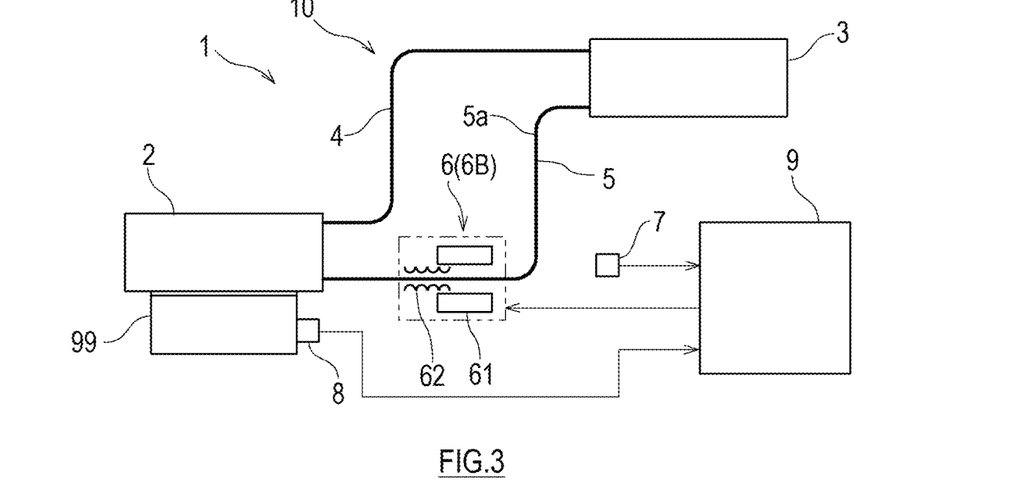
FIG. 3 illustrates a schematic configuration of the heat transport system in which a magnetic fluid-driving pump is used as the pump of FIG. 1.

FIG. 3 illustrates a schematic configuration of the heat transport system 1 in which the magnetic fluid-driving pump 6B is used as the pump 6 of FIG. 1. The magnetic fluid-driving pump 6B of FIG. 3 includes a heater 62 that heats the working fluid flowing in the liquid conduit 5 and an electromagnet 61 that applies a magnetic field to the working fluid flowing in the liquid conduit 5. The electromagnet 61 may be a permanent magnet. Whether to perform the heating by the heater 62 and whether to perform the magnetic field application by the electromagnet 61 are controlled by the controller 9. The working fluid is a temperature-sensitive magnetic fluid composed of a liquid matrix and fine magnetic particles dispersed in the matrix, and the intensity of magnetization of the working fluid drastically decreases with increasing temperature in the normal temperature range. The part of the liquid conduit 5 that is heated by the heater 62 will be referred to as a "heated region", and the part of the liquid conduit 5 that is exposed to a magnetic field applied by the electromagnet 61 will be referred to as a "magnetic field-exposed region". A downstream portion of the magnetic field-exposed region and an upstream portion of the heated region overlap each other. It should be noted that the end of the liquid conduit 5 that is connected to the condenser 3 is defined as the "upstream" end and the end of the liquid conduit 5 that is connected to the evaporator 2 is defined as the "downstream" end.

In the active mode, namely when the pump 6B configured as described above is running, the electromagnet 61 applies a non-uniform magnetic field to the magnetic field-exposed region and the heater 62 heats the portion of the liquid conduit 5 that is downstream of the point where the intensity of the magnetic field applied to the magnetic field-exposed region is at the maximum. Since the temperature-sensitive magnetic fluid has the temperature-sensitive magnetization property, an increase in temperature decreases the intensity of magnetization of the fluid and reduces the magneto-volume effect. Thus, as the working fluid moves downstream in the heated region, the magneto-volume effect decreases, and consequently a drive force that allows the working fluid to flow further downstream is generated. The magnitude of the circulation drive force exerted on the working fluid can be adjusted depending on the degree of heating (temperature) of the heated region.

In the passive mode, namely when the pump 6B configured as described above is at rest, the magnetic field application by the electromagnet 61 and the heating by the heater 62 are stopped. Thus, the working fluid flows in the liquid conduit 5 without being subjected to any action of the pump 6B. When the electromagnet 61 is a permanent magnet, the absence of the heating by the heater 62 leads to the difference in magneto-volume effect between the upstream and downstream portions being eliminated and hence the circulation of the working fluid being stopped.

Figure 4:
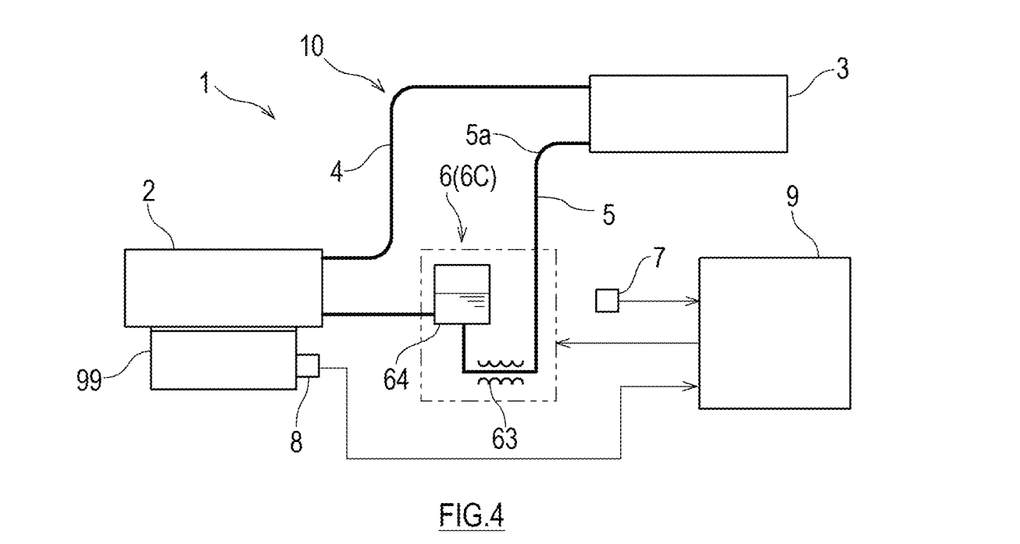
FIG. 4 illustrates a schematic configuration of the heat transport system in which a tank pressure pump is used as the pump of FIG. 1.

FIG. 4 illustrates a schematic configuration of the heat transport system 1 in which the tank pressure pump 6C is used as the pump 6 of FIG. 1. The tank pressure pump 6C of FIG. 4 includes a tank 64 disposed in the liquid conduit 5 and a heater 63 disposed in the liquid conduit 5 and located upstream of the tank 64. Whether to perform the heating by the heater 63 is controlled by the controller 9.

In the active mode, namely when the pump 6C configured as described above is running, the heater 63 heats the working fluid flowing in the liquid conduit 5. Thus, a part of the working fluid changes into the gas phase, and the working fluid containing bubbles flows into the tank 64 to increase the pressure inside the tank 64, with the result that the working fluid is forced to flow from the tank 64 to the evaporator 2.

In the passive mode, namely when the pump 6C configured as described above is at rest, the heating by the heater 63 is stopped. Thus, the working fluid flows in the liquid conduit 5 without being subjected to any action of the pump 6C.

Tilt Sensor 7

The tilt sensor 7 detects tilt information for determining the tilt of the loop heat pipe 10 with respect to a predetermined reference position of the loop heat pipe 10. In the loop heat pipe 10, in order to allow the working fluid to circulate under the action of gravity, a balance needs to be achieved between the pressure loss accompanying the working fluid circulation and the head difference occurring due to the amount of the liquid phase of the working fluid being larger in the condenser 3 than in the evaporator 2. Typically, the loop heat pipe 10 is placed on a horizontal surface, and the evaporator 2 and condenser 3 are located at different heights such that the balance between the pressure loss and the head difference is achieved. Thus, the reference position of the loop heat pipe 10 may be, for example, a position assumed by the loop heat pipe 10 placed on a horizontal surface. The tilt sensor 7 may be mounted on the loop heat pipe 10 itself. Alternatively, the tilt sensor 7 may be mounted on an element that behaves in conjunction with the loop heat pipe 10, and an example of such an element is a floor on which the loop heat pipe 10 is installed. Known examples of the tilt sensor 7 include an acceleration sensor and a gyro sensor.

A typical transportation machine includes a tilt sensor that detects the tilt of the body of the machine and an indicator that indicates the tilt of the body based on the value detected by the tilt sensor. Thus, when the heat transport system 1 is incorporated in such a transportation machine, the value of the body tilt as indicated by the indicator may be used as the tilt information.

A typical transportation machine includes a maneuvering device (such as a control stick or steering wheel) to which a command to change the position of the body of the machine is input. Thus, when the heat transport system 1 is incorporated in such a transportation machine, a body maneuvering command (such as an ascending command, a submergence command, a descending command, or a turning command) input to the maneuvering device may be used as the tilt information.

Temperature Sensor 8

The temperature sensor 8 detects temperature information for determining the temperature of the heat source 99 (i.e., a cooling target) that provides heat to the evaporator 2. A sensor suitable for determining the temperature of the heat source 99 is selected as the temperature sensor 8 from among various kinds of known temperature sensors.

Controller 9

The controller 9 is electrically connected to the tilt sensor 7 and temperature sensor 8 by wire or wirelessly, and acquires the values detected by these sensors. The controller 9 is electrically connected to the pump 6 by wire or wirelessly, and sends control signals to the pump 6 to control the operation of the pump 6.

The controller 9 is a so-called computer and includes, for example, a processing unit 90a (processor) such as a microcontroller, a CPU, an MPU, a PLC, a DSP, an ASIC, or an FPGA and a storage unit 90b including volatile and non-volatile memories such as a RAM and ROM (neither of these units are shown). The storage unit 90b stores programs to be executed by the processing unit and various kinds of fixed data. In the controller 9, the processing unit 90a retrieves and executes software such as the programs stored in the storage unit 90b, thereby performing procedures for implementing the functional circuitries mentioned later. The controller 9 may consist of a single computer that performs the procedures by centralized control or may be constituted by a plurality of computers cooperative to perform the procedures by distributed control.

Flow of Tilt Monitoring Process

Figure 5:
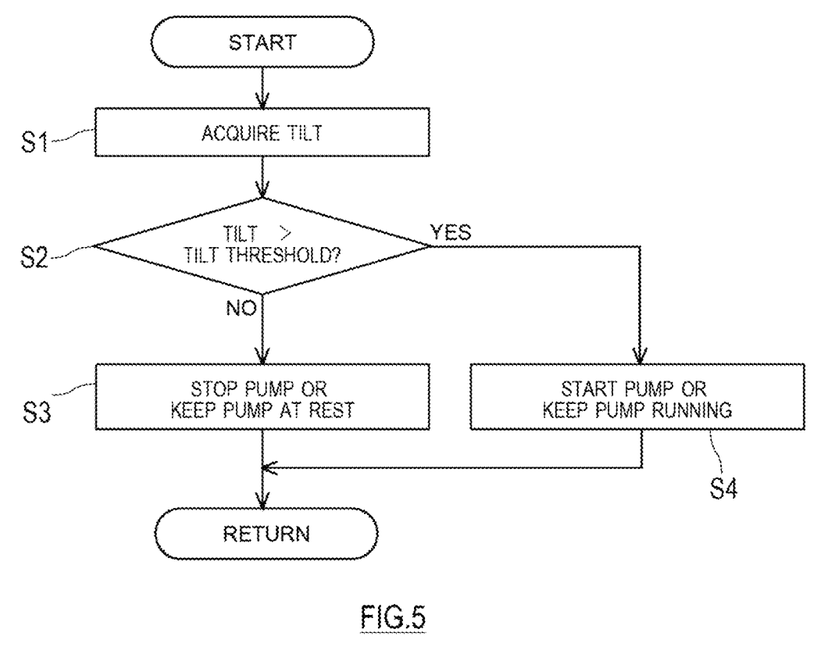
FIG. 5 is a flowchart illustrating the flow of a tilt monitoring process in the heat transport system.

Hereinafter, the flow of a tilt monitoring process performed by the controller 9 to monitor the tilt of the loop heat pipe 10 will be described. In the controller 9, the processing unit 90a retrieves a tilt monitoring program from the storage unit 90b and executes the program to perform various procedures for implementing the functions of a tilt monitoring circuitry 91, a temperature monitoring circuitry 92, and a pump control circuitry 93. The tilt monitoring program includes a tilt monitoring module, a temperature monitoring module, and a pump control module, and causes the controller 9 to perform the tilt monitoring process. FIG. 5 is a flowchart illustrating the flow of the tilt monitoring process performed by the controller 9.

As shown in FIG. 5, the tilt monitoring circuitry 91 of the controller 9 acquires information related to the tilt of the loop heat pipe 10 from the tilt sensor 7 (step S1). The tilt monitoring circuitry 91 monitors the tilt of the loop heat pipe 10 by comparing the acquired tilt to a predetermined tilt threshold (step S2).

Once the position of the loop heat pipe 10 changes from the reference position, the height difference between the locations of the evaporator 2 and condenser 3 changes, and accordingly the head difference changes. This leads to a deterioration in the flow characteristics of the working fluid or a change in thermal resistance, resulting in a reduction in the heat transfer performance. The tilt threshold may be set based on the acceptable range of the reduction in heat transfer performance of the loop heat pipe 10. The increasing tilt of the loop heat pipe 10 eventually causes dry out (a phenomenon in which the working fluid becomes unable to return to the evaporator 2), upon which the heat transport ceases. The tilt threshold may be set so as to prevent this dry out. The tilt threshold is specific to the loop heat pipe 10. The threshold is predetermined by experimentation or simulation based on design parameters of the loop heat pipe 10 (such as the structures of the evaporator 2 and condenser 3, the height difference between the locations of the evaporator 2 and condenser 3 in the reference position, the lengths and diameters of the vapor conduit 4 and liquid conduit 5, and the amount of the charged working fluid), and the predetermined threshold is set in the controller 9.

Under steady-state conditions, the heat transport system 1 is operated in the passive mode. If the tilt of the loop heat pipe 10 is equal to or smaller than the tilt threshold (NO in step S2), the heat transport system 1 is operated in the passive mode, and the pump 6 is stopped or kept at rest (step S3). If the tilt of the loop heat pipe 10 is greater than the tilt threshold (YES in step S2), the heat transport system 1 is operated in the active mode, and the pump 6 is started or kept running (step S4). Specifically, if the tilt is greater than the tilt threshold, the tilt monitoring circuitry 91 outputs a signal that causes the pump control circuitry 93 to run the pump 6. The pump 6 may exert the circulation drive force on the working fluid in such a manner as to maintain the circulation flow rate of the working fluid at a predetermined value. The tilt monitoring circuitry 91 returns the process to step S1 and continues monitoring the tilt of the loop heat pipe 10. If the determined tilt becomes equal to or smaller than the tilt threshold, the tilt monitoring circuitry 91 outputs a signal that causes the pump control circuitry 93 to stop the pump 6.

Flow of Temperature Monitoring Process

Figure 6:
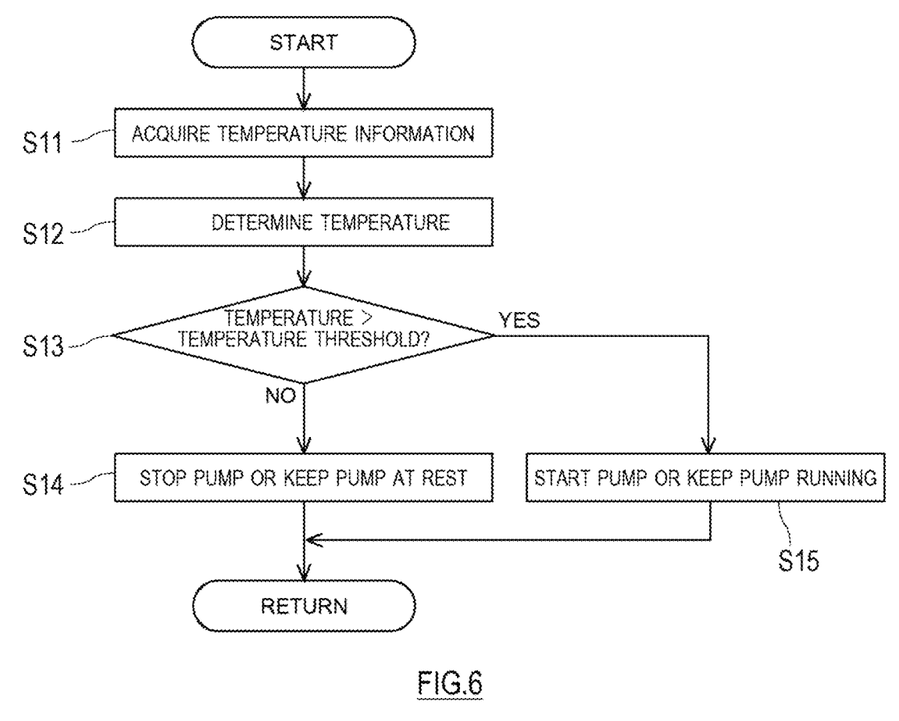
FIG. 6 is a flowchart illustrating the flow of a temperature monitoring process in the heat transport system.

Next, the flow of a temperature monitoring process performed by the controller 9 will be described. FIG. 6 is a flowchart illustrating the flow of the temperature monitoring process performed by the controller 9. The tilt monitoring process described above and the temperature monitoring process may be performed concurrently, or one of these processes may be given priority over the other.

As shown in FIG. 6, the temperature monitoring circuitry 92 of the controller 9 acquires temperature information related to the temperature of the heat source 99 from the temperature sensor 8 (step S11), and determines the temperature of the heat source 99 based on the acquired temperature information (step S12). When the information acquired from the temperature sensor 8 is one which directly indicates the temperature of the heat source 99, the temperature monitoring circuitry 92 may perform steps S11 and S12 collectively as the step of acquiring the temperature of the heat source 99 from the temperature sensor 8. The temperature monitoring circuitry 92 monitors the temperature of the heat source 99 by comparing the temperature of the heat source 99 to a predetermined temperature threshold (step S13).

Under steady-state conditions, the heat transport system 1 is operated in the passive mode. If the temperature of the heat source 99 is equal to or lower than the temperature threshold (NO in step S13), the heat transport system 1 is operated in the passive mode, and the pump 6 is stopped or kept at rest (step S14). If the temperature of the heat source 99 is higher than the temperature threshold (YES in step S13), the heat transport system 1 is operated in the active mode, and the pump 6 is started or kept running (step S15). Specifically, if the acquired temperature is higher than the temperature threshold, the temperature monitoring circuitry 92 outputs a signal that causes the pump control circuitry 93 to run the pump 6. The temperature monitoring circuitry 92 returns the process to step S11 and continues monitoring the temperature of the heat source 99. If the determined temperature becomes equal to or lower than the temperature threshold, the temperature monitoring circuitry 92 outputs a signal that causes the pump control circuitry 93 to stop the pump 6.

As described above, the heat transport system 1 according to the exemplary embodiment includes: a loop heat pipe 10 charged with a working fluid, the loop heat pipe 10 including an evaporator 2 that changes at least a part of the working fluid from a liquid phase into a gas phase by heat absorbed from a heat source 99, a condenser 3 located above the evaporator 2 to change the working fluid from the gas phase into the liquid phase, a vapor conduit 4 connecting an outlet of the evaporator 2 and an inlet of the condenser 3, and a liquid conduit 5 connecting an outlet of the condenser 3 and an inlet of the evaporator 2; a pump 6 disposed in the liquid conduit 5 or the vapor conduit 4 to exert a circulation drive force on the working fluid; a tilt sensor 7 that detects a tilt of the loop heat pipe 10; and a controller 9 that controls operation of the pump 6 based on the tilt. The working fluid in the liquid conduit 5 flows from the condenser 3 to the evaporator 2 without being subjected to the action of the pump 6 when the pump 6 is at rest, and is forced to flow from the condenser 3 to the evaporator 2 under the action of the pump 6 when the pump 6 is running. The controller 9 is configured to run the pump 6 if the tilt is greater than a predetermined tilt threshold and stop the pump 6 if the tilt is equal to or smaller than the tilt threshold.

In other words, the controller 9 includes a storage unit 90*b* storing a tilt monitoring program and the tilt threshold and a processing unit 90*a* that executes the tilt monitoring program, and the tilt monitoring program is configured to cause the processing unit 90*a* to run the pump 6 if the tilt is greater than the predetermined tilt threshold and stop the pump 6 if the tilt is equal to or smaller than the tilt threshold.

In the above heat transport system 1, when the tilt of the loop heat pipe 10 is equal to or smaller than the threshold, i.e., during steady-state operation, the pump 6 is at rest, and the working fluid circulates in the loop heat pipe 10 without the need for external energy. When the tilt of the loop heat pipe 10 is greater than the threshold, the gravity-derived circulation drive force acting on the working fluid decreases, while the pump 6 exerts a circulation drive force on the working fluid to compensate for the decrease in the gravity-derived force. Thus, in the heat transport system 1, the working fluid circulates stably irrespective of changes in the position of the loop heat pipe 10, and a stable heat transport rate can be achieved. Although the heat transport system 1 requires external energy for running of the pump 6, the pump 6 runs only under predetermined conditions and is at rest under the other conditions. As such, the consumption of external energy can be lower than in the case where the pump 6 is always running. For the above reasons, the heat transport system 1 of the present invention can exhibit stable heat transfer performance despite changes in the position of the loop heat pipe 10 and at the same time achieve a reduction in external energy consumption.

As illustrated in the exemplary embodiment, the heat transport system 1 may further include a temperature sensor 8 that detects the temperature of the heat source 99 that provides heat to the working fluid flowing in the evaporator 2. In this case, the controller 9 is configured to acquire the temperature of the heat source 99 from the temperature sensor 8 and configured to run the pump 6 if the temperature is higher than a predetermined temperature threshold and stop the pump 6 if the temperature is equal to or lower than the temperature threshold.

Thus, when the heat source 99 cannot be cooled sufficiently by circulation of the working fluid at a natural circulation flow rate, namely when the circulation flow rate of the working fluid is insufficient, the pump 6 exerts a drive force on the working fluid to compensate for the lack of the circulation flow rate, thereby increasing the circulation flow rate of the working fluid and hence the heat transport rate of the heat transport system 1. Consequently, the heat transfer performance of the heat transport system 1 is enhanced, and the heat source 99 can be reliably cooled to a desired temperature.

In the heat transport system 1, as illustrated in the exemplary embodiment, the pump 6 may be an electric pump 6A disposed in the liquid conduit 5, and the liquid conduit 5 may include a bypass conduit 59 through which the working fluid flows to bypass the pump 6.

In this case, when the pump 6A is at rest, the working fluid bypasses the pump 6A and flows through the bypass conduit 59, and thus the flow of the working fluid is not disturbed by the pump 6A.

In the heat transport system 1, as illustrated in the exemplary embodiment, the working fluid may be a temperature-sensitive magnetic fluid, and the pump 6B may include a magnet 61 that applies a non-uniform magnetic field to the working fluid flowing in the liquid conduit 5 and a heater 62 that heats the working fluid magnetized by the applied magnetic field.

When at rest, such a pump 6B does not act on the working fluid flowing in the liquid conduit 5 in which the pump 6B is located. Thus, the pressure loss can be lower and consequently the heat transfer performance of the heat transport system 1 can be higher than in the case where the liquid conduit 5 includes the bypass conduit 59 through which the working fluid flows to bypass the pump 6A. Additionally, the working fluid does not directly contact the magnet 61 or heater 62, and the pump 6B includes no mechanical drive parts. As such, the pump 6b is easily maintainable and has high durability. Moreover, the use of the pump 6B configured as described above can save more electric power than the use of an electric pump.

In the heat transport system 1, as illustrated in the exemplary embodiment, the pump 6C may include a tank 64 located in the liquid conduit and a heater 63 located inside the tank 64 or upstream of the tank 64 in the flow direction of the working fluid and exert the circulation drive force on the working fluid by a pressure of a vapor resulting from heating by the heater 63.

When at rest, such a pump 6C does not act on the working fluid flowing in the liquid conduit 5 in which the pump 6C is located. Thus, the pressure loss can be lower and consequently the heat transfer performance of the heat transport system 1 can be higher than in the case where the liquid conduit 5 includes the bypass conduit 59 through which the working fluid flows to bypass the pump 6A. Additionally, the pump 6C includes no drive parts, thus being easily maintainable and having a long service life.

Variant of Flow of Tilt Monitoring Process

In the heat transport system 1, the tilt monitoring process and temperature monitoring process may be performed independently of each other as described above. However, combining these processes can stabilize the heat transport rate of the loop heat pipe 10 more economically, and can stabilize the degree of cooling of the heat source 99 by the evaporator 2.

Figure 7:
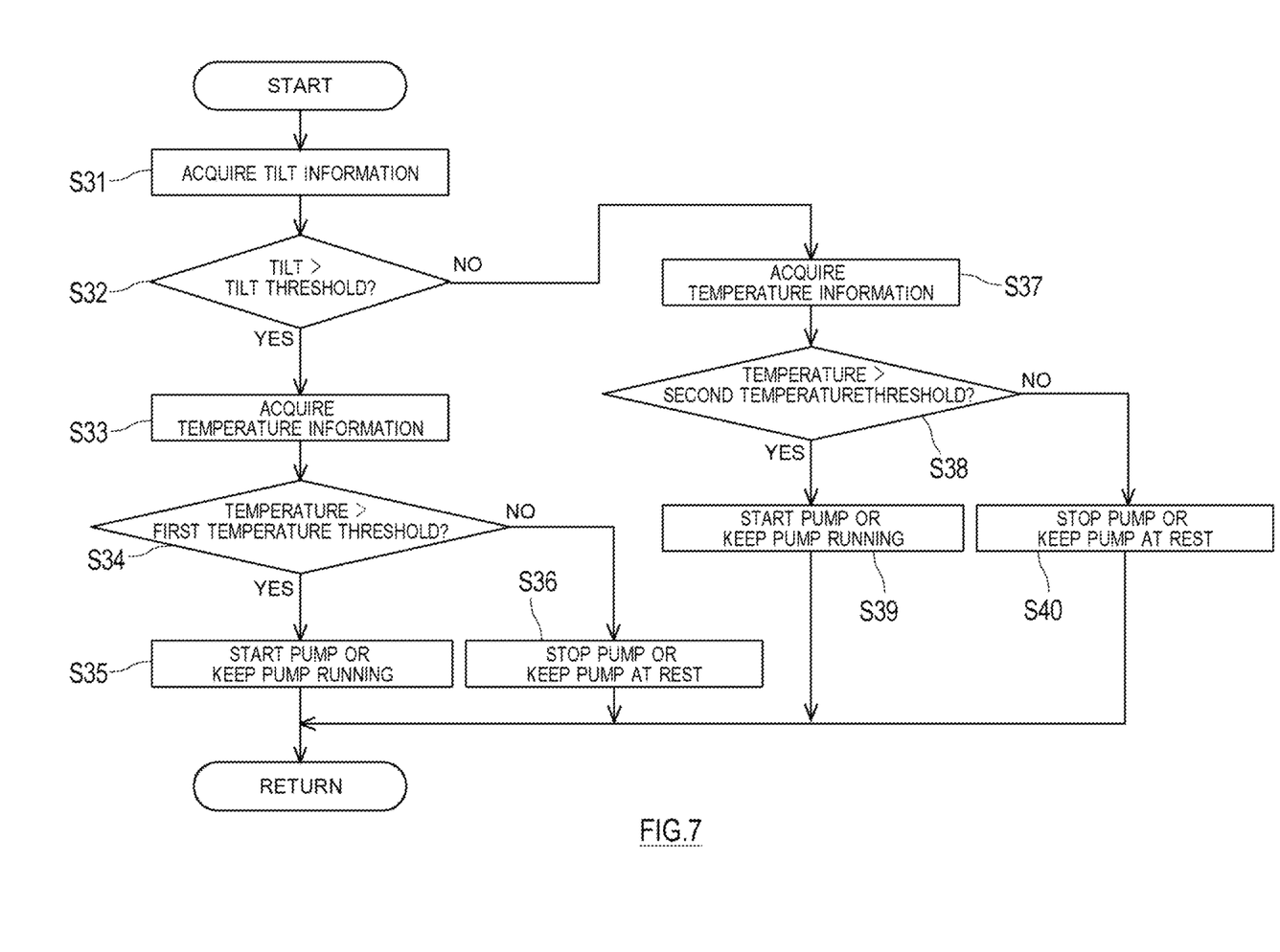
FIG. 7 is a flowchart illustrating a variant of the flow of the temperature monitoring process in the heat transport system.

FIG. 7 is a flowchart illustrating a variant of the flow of the tilt monitoring process performed by the controller 9. The storage unit of the controller 9 prestores a tilt threshold, a first temperature threshold, and a second temperature threshold.

As shown in FIG. 7, the tilt monitoring circuitry 91 of the controller 9 acquires tilt-related information from the tilt sensor 7 (step S31). The tilt monitoring circuitry 91 monitors the tilt of the loop heat pipe 10 by comparing the acquired tilt to the predetermined tilt threshold (step S32).

If the tilt is greater than the predetermined tilt threshold (YES in step S32), the tilt monitoring circuitry 91 acquires the temperature of the heat source 99 from the temperature sensor 8 (step S33), and compares the temperature of the heat source 99 to the predetermined first temperature threshold (step S34). If the temperature of the heat source 99 is higher than the first temperature threshold (YES in step S34), the tilt monitoring circuitry 91 outputs a signal that causes the pump control circuitry 93 to run the pump 6 (step S35), and returns the process to step S31. If the temperature of the heat source 99 is equal to or lower than the first temperature threshold (NO in step S34), the tilt monitoring circuitry 91 outputs a signal that causes the pump control circuitry 93 to stop the pump 6 (step S36), and returns the process to step S31.

If the tilt is equal to or smaller than the predetermined tilt threshold (NO in step S32), the tilt monitoring circuitry 91 acquires the temperature of the heat source 99 from the temperature sensor 8 (step S37), and compares the temperature of the heat source 99 to the predetermined second temperature threshold (step S38). If the temperature of the heat source 99 is higher than the second temperature threshold (YES in step S38), the tilt monitoring circuitry 91 outputs a signal that causes the pump control circuitry 93 to run the pump 6 (step S39), and returns the process to step S31. If the temperature of the heat source 99 is equal to or lower than the first temperature threshold (NO in step S38), the tilt monitoring circuitry 91 outputs a signal that causes the pump control circuitry 93 to stop the pump 6 (step S40), and returns the process to step S31.

When the tilt of the loop heat pipe 10 is greater than the tilt threshold, the heat transport performance is lower than when the tilt is equal to or smaller than the tilt threshold. Thus, in the former case, it is recommended that the pump 6 be run to exert an additional circulation drive force on the working fluid and enhance the heat transport performance while the temperature of the heat source 99 is still below a temperature range over which in the latter case the pump is run. Thus, the first temperature threshold is desirably equal to or lower than the second temperature threshold. In this case, the pump 6 can be brought into operation before the circulation drive force acting on the working fluid decreases and cooling of the heat source 99 becomes insufficient. Consequently, an excessive temperature increase of the heat source 99 can be prevented.

As described above, the controller 9 of the heat transport system 1 is configured to: run the pump 6 if the tilt is greater than a predetermined tilt threshold and the temperature of the heat source 99 is higher than a predetermined first temperature threshold; stop the pump 6 if the tilt is greater than the tilt threshold and the temperature of the heat source 99 is equal to or lower than the first temperature threshold; run the pump 6 if the tilt is equal to or smaller than the tilt threshold and the temperature of the heat source 99 is higher than a predetermined second temperature threshold; and stop the pump 6 if the tilt is equal to or smaller than the tilt threshold and the temperature of the heat source 99 is equal to or lower than the second temperature threshold.

In other words, the controller 9 includes a storage unit 90*b* storing a tilt monitoring program according to the variant, a tilt threshold, a first temperature threshold, and a second temperature threshold and a processing unit 90*a* that executes the tilt monitoring program according to the variant, and the tilt monitoring program according to the variant is configured to cause the processing unit 90a to: run the pump 6 if the tilt is greater than the predetermined tilt threshold and the temperature of the heat source 99 is higher than the first temperature threshold; stop the pump 6 if the tilt is greater than the predetermined tilt threshold and the temperature of the heat source 99 is equal to or lower than the first temperature threshold; run the pump 6 if the tilt is equal to or smaller than the tilt threshold and the temperature of the heat source 99 is higher than the second temperature threshold; and stop the pump 6 if the tilt is equal to or smaller than the tilt threshold and the temperature of the heat source 99 is equal to or lower than the second temperature threshold.

In the above heat transport system 1, even when the tilt of the loop heat pipe 10 is greater than the tilt threshold, cooling of the heat source 99 is determined to be sufficient if the temperature of the heat source 99 is equal to or lower than the first temperature threshold, and the pump 6 is stopped or kept at rest, so that the working fluid circulates in the loop heat pipe without the need for external energy. Thus, the heat transport rate of the loop heat pipe 10 can be stabilized more economically. In the heat transport system 1, even when the tilt of the loop heat pipe 10 is equal to or smaller than the tilt threshold, the pump 6 is started or kept running to exert an additional circulation drive force on the working fluid if the temperature of the heat source 99 is higher than the second temperature threshold. Thus, the degree of cooling of the heat source 99 by the evaporator 2 can be stabilized. Although the heat transport system 1 requires external energy for running of the pump 6, the pump 6 runs only under predetermined conditions and is at rest under the other conditions. As such, the consumption of external energy can be lower than in the case where the pump 6 is always running. For the above reasons, the heat transport system 1 can exhibit stable heat transfer performance despite changes in the position of the loop heat pipe 10 and at the same time achieve a reduction in external energy consumption.

Transportation Machine Incorporating Heat Transport System 1

Figure 8:
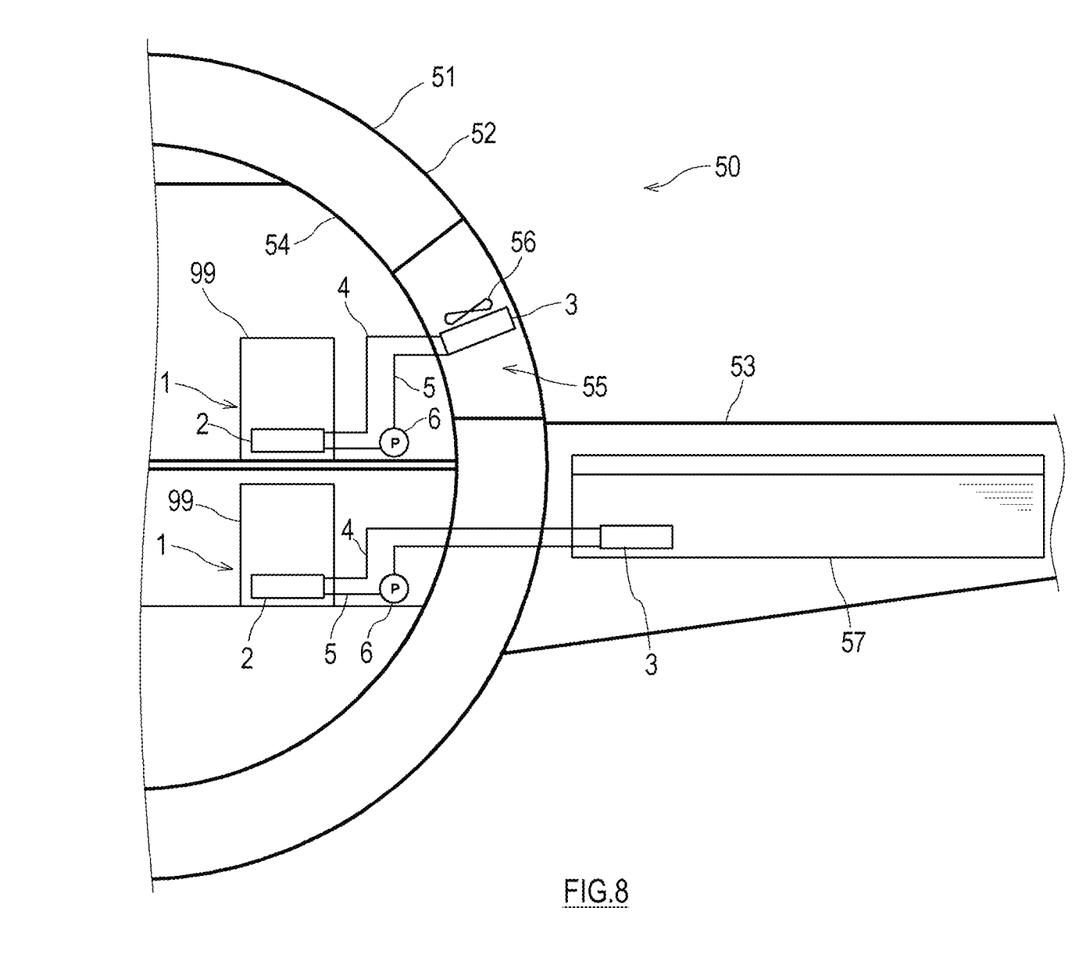
FIG. 8 illustrates an example where the heat transport system is applied to an aircraft.

The following describes an example where the heat transport system 1 described above is applied to a transportation machine. The heat transport system 1 can be used to cool heat-generating elements mounted on transportation machines such as watercrafts (including submersibles), railcars, automobiles, and aircrafts. FIG. 8 illustrates an example where the heat transport system 1 is applied to an aircraft 50 which is an example of the transportation machines.

FIG. 8 partially shows a fuselage 51 and main wing 53 of the aircraft 50. The fuselage 51 has a multilayer structure including an outer panel 52 and an interior wall 54 located closer to the cabin than the outer panel 52. Between the outer panel 52 and interior wall 54 is defined a cooling chamber 55. The temperature inside the cooling chamber 55 is low because of cold energy transferred from the outer panel 52 which during flight is exposed to outside air (an example of the external fluid) having a considerably lower temperature than that near the ground. Alternatively, the outer panel 52 may be provided with an air inlet and air outlet communicating with the cooling chamber 55, and ram air may be introduced into the cooling chamber 55 during flight. The main wing 53, which during flight is exposed to outside air having a considerably lower temperature than that near the ground, has an interior enclosing a fuel tank 57. The fuel tank 57 and the fuel stored in it are cooled by the outside air.

The above aircraft 50 incorporates two heat transport systems 1. One of the heat transport systems 1 is intended to cool a heat source 99 placed on the floor of the fuselage 51, and includes an evaporator 2 thermally connected to the heat source 99, a condenser 3 located in the cooling chamber 55, vapor and liquid conduits 4 and 5 connecting the evaporator 2 and condenser 3, and a pump 6 disposed in the liquid conduit 5. In the cooling chamber 55 is disposed a fan 56 for forcing a gas flow to pass the condenser 3. The condenser 3 releases heat to that gas in the cooling chamber 55 which is cooled by the outside air. That is, the condenser 3 can condense the working fluid using cold energy from the outside air. Additionally, during flight of the aircraft 50, the temperature of the outside air is considerably lower than normal temperatures, and thus a large temperature difference is created between the heat source 99 to which the evaporator 2 is thermally connected and the medium (the gas in the cooling chamber 55) to which the condenser 3 releases heat. In consequence, highly efficient heat transport can be achieved by the heat transport system 1.

The other heat transport system 1 is intended to cool a heat source 99 located beneath the floor of the fuselage 51, and includes an evaporator 2 thermally connected to the heat source 99, a condenser 3 located in a liquid phase contained in the fuel tank 57, vapor and liquid conduits 4 and 5 connecting the evaporator 2 and condenser 3, and a pump 6 disposed in the liquid conduit 5. The condenser 3 releases heat to the fuel cooled by the outside air. That is, the condenser 3 can condense the working fluid using cold energy from the outside air. Additionally, during flight of the aircraft 50, the temperature of the outside air is considerably lower than normal temperatures, and thus a large temperature difference is created between the heat source 99 to which the evaporator 2 is thermally connected and the medium (the fuel) to which the condenser 3 releases heat. In consequence, highly efficient heat transport can be achieved by the heat transport system 1. It should be noted that the fuel tank 57 need not be adapted to actively exchange heat with the external fluid.

As described above, the transportation machine (e.g., aircraft 50) according to the exemplary embodiment includes a heat source 99 and the heat transport system 1, and the evaporator 2 of the heat transport system 1 evaporates the working fluid by heat absorbed from the heat source 99. In the heat transport system 1, as previously stated, the working fluid circulates stably irrespective of changes in the position of the loop heat pipe 10, and a stable heat transport rate can be achieved. As such, the heat transport system 1 is suitable for cooling a heat source 99 located in a transportation machine the position of which constantly changes. Examples of the heat source 99 include, but are not limited to: an electronic device including heat-generating parts, such as a control board, an engine control unit (ECU), or a computer; a friction heat-generating mechanical part such as a bearing; a heat-generating element such as a battery; and air inside the cabin.

As illustrated in the exemplary embodiment, the transportation machine may include an outer panel 52 exposed to an external fluid and an interior wall 54 located inward of the outer panel 52, and a condenser 3 may be located in a cooling chamber 55 defined between the outer panel 52 and the interior wall 54.

Thus, the heat transport system 1 incorporated in the transportation machine can condense the working fluid using cold energy from the external fluid (outside air). In particular, when the transportation machine is for use in an environment where the temperature of the outside air is considerably lower than normal temperatures, a large temperature difference is created between the heat source 99 to which the evaporator 2 is thermally connected and the medium to which the condenser 3 releases heat and, in consequence, highly efficient heat transport can be achieved by the heat transport system 1.

As illustrated in the exemplary embodiment, the transportation machine may include a fuel tank 57, and the condenser 3 may be located in a liquid phase contained in the fuel tank 57.

Thus, the heat transport system 1 incorporated in the transportation machine can condense the working fluid using the fuel tank 57 having a high heat capacity. In particular, when the fuel tank 57 is adapted to actively exchange heat with an external fluid having a low temperature, a large temperature difference is created between the heat source 99 to which the evaporator 2 is thermally connected and the medium to which the condenser 3 releases heat and, in consequence, highly efficient heat transport can be achieved by the heat transport system 1.

Although the foregoing has described a preferred embodiment of the present invention, the scope of the present invention embraces modifications made to the details of the structure and/or function of the above embodiment without departing from the concept of the present invention.

For example, the loop heat pipe 10 of the above embodiment is not limited to the thermosyphon type, and may be of the wick type. The loop heat pipe of the wick type uses not only the capillary force acting on the working fluid in the wick but also gravity to return the working fluid from the condenser 3 to the evaporator 2. Thus, the present invention can offer the benefits as described above also when applied to a heat transport system including a loop heat pipe of the wick type.

The invention claimed is:

1. A heat transport system incorporated into a transportation machine, comprising:
    a loop heat pipe charged with a working fluid, the loop heat pipe including:
        an evaporator that changes at least a part of the working fluid from a liquid phase into a gas phase by heat absorbed from a heat source,
        a condenser located above the evaporator to change the working fluid from the gas phase into the liquid phase,
        a vapor conduit connecting an outlet of the evaporator and an inlet of the condenser, and
        a liquid conduit connecting an outlet of the condenser and an inlet of the evaporator;
    a pump disposed in the liquid conduit or the vapor conduit to exert a circulation drive force on the working fluid;
    a tilt sensor that detects a tilt of the loop heat pipe;
    a temperature sensor that detects a temperature of the heat source; and
    a controller that controls operation of the pump, wherein:
        the working fluid in the liquid conduit flows from the condenser to the evaporator without being subjected to an action of the pump when the pump is at rest, and is forced to flow from the condenser to the evaporator under the action of the pump when the pump is running,
    the controller is configured to:
        run the pump if the tilt is greater than a predetermined tilt threshold and the temperature of the heat source is higher than a predetermined first temperature threshold;
        stop the pump if the tilt is greater than the predetermine tilt threshold and the temperature of the heat source is equal to or lower than the first temperature threshold;
        run the pump if the tilt is equal to or smaller than the predetermined tilt threshold and the temperature of the heat source is higher than a predetermined second temperature threshold; and
        stop the pump if the tilt is equal to or smaller than the predetermined tilt threshold and the temperature of the heat source is equal to or lower than the second temperature threshold, and
    the first temperature threshold is lower than the second temperature threshold.

2. The heat transport system according to claim 1, wherein the liquid conduit includes a bypass conduit through which the working fluid flows to bypass the pump.

3. The heat transport system according to claim 1, wherein
    the working fluid is a temperature-sensitive magnetic fluid, and
    the pump includes a magnet that applies a non-uniform magnetic field to the working fluid flowing in the liquid conduit and a heater that heats the working fluid magnetized by the applied magnetic field.

4. The heat transport system according to claim 1, wherein
    the pump includes a tank located in the liquid conduit and a heater located inside the tank or upstream of the tank in a flow direction of the working fluid, and
    the pump exerts the circulation drive force on the working fluid by a pressure of a vapor resulting from heating by the heater.

5. A transportation machine comprising:
    a heat-generating element; and
    the heat transport system according to claim 1, wherein the evaporator of the heat transport system uses the heat-generating element as a heat source to evaporate the working fluid.

6. The transportation machine according to claim 5, further comprising:
    an outer panel exposed to an external fluid; and
    an interior wall located inward of the outer panel,
    wherein the condenser is located in a cooling chamber defined between the outer panel and the interior wall.

7. The transportation machine according to claim 5, further comprising:
    a fuel tank,
    wherein the condenser is located in a liquid phase contained in the fuel tank.

* * * * *